United States Patent [19]

Sugahara

[11] Patent Number: 5,495,435

[45] Date of Patent: Feb. 27, 1996

[54] SYNCHRONOUS DRAM MEMORY MODULE

[75] Inventor: Kenji Sugahara, Tokyo, Japan

[73] Assignee: NEC Corporation, Tokyo, Japan

[21] Appl. No.: 339,730

[22] Filed: Nov. 14, 1994

[30] Foreign Application Priority Data

Nov. 18, 1993 [JP] Japan .................................. 5-312726

[51] Int. Cl.$^6$ .................................................. G11C 11/34
[52] U.S. Cl. ........................ 365/52; 365/63; 365/230.03
[58] Field of Search ................................. 365/51, 52, 63, 365/230.03

[56] References Cited

U.S. PATENT DOCUMENTS 5,270,964  12/1993  Bechtolsheim et al. .................. 365/52
5,272,664  12/1993  Alexander et al. ...................... 365/52

*Primary Examiner*—Joseph A. Popek
*Attorney, Agent, or Firm*—Sughrue, Mion, Zinn, Macpeak & Seas

[57] ABSTRACT

A clock driver is mounted in the center of a printed-circuit board, and a plurality of synchronous DRAMs are arranged on left and right hand sides of the clock driver in different banks. A clock signal is supplied from the clock driver to the synchronous DRAMs via clock wires. Wiring distances for supplying the clock pulse from the clock driver to a pair of synchronous DRAMs included in the different banks are determined to nearly equal to prevent a time difference of a timing signal in a data recording and reproducing operations of the respective banks and to solve a skew mismatching.

11 Claims, 3 Drawing Sheets

F I G. 5
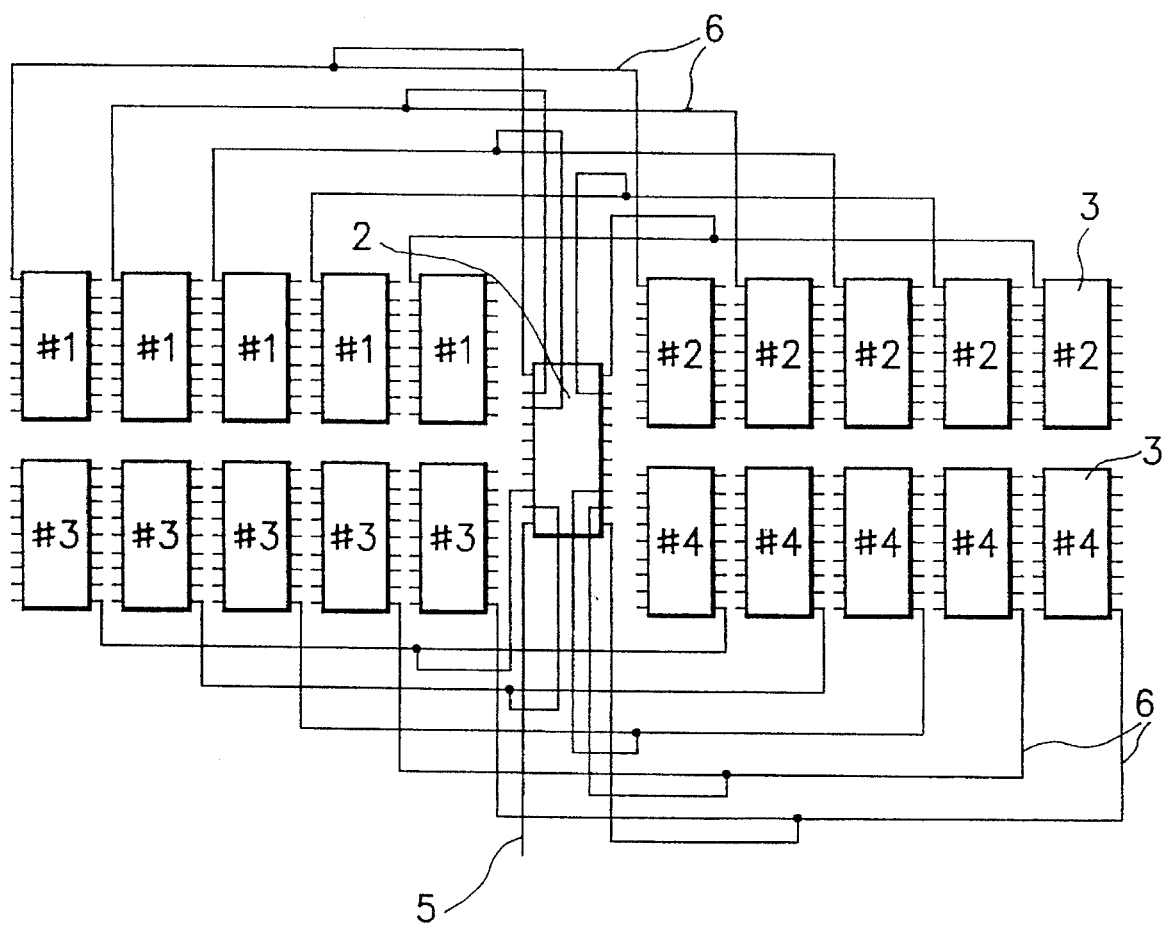

SYNCHRONOUS DRAM MEMORY MODULE

BACKGROUND OF THE INVENTION

The present invention relates to a synchronous DRAM memory module having a clock signal wiring configuration permitting a high speed operation.

DESCRIPTION OF THE RELATED ARTS

Conventionally, as an add-on memory of a computer or the like, a memory module mounting a plurality of DRAMs on a printed-circuit board is widely used. In FIG. 1, there is shown a conventional memory module using a plurality of DRAMs.

In this case, a plurality of DRAMs 7 are separately arranged on first and second banks #1 and #2 on a printed-circuit board and different CAS (column address strobe) wires 8a and 8b and RAS (row address strobe) wires 9a and 9b are attached to the banks #1 and #2. And different RAS signals and GAS signals are supplied to the banks #1 and #2 from a system unit of a computer using the memory module so as to carry out a data reading or writing.

However, in recent years, an MPU (micro processor unit) constituting the system unit of the computer has moved forward toward faster and one operating at a high speed of 100 MHz is available. On the other hand, though the DRAMs 7 have remarkably developed in respect of memory capacity, improvement has been performed moderately in relation to high speed operation. As a result, dissociation of the operation speed between the MPU (not shown) and the DRAMs 7 tends to further advance. In order to solve this problem, there is a synchronous DRAM as one of the expected measures.

In this case, a predetermined clock signal is supplied to a clock input terminal, and by synchronizing with this, a direct contact operation with the MPU can be carried out. For example, a precharge time can be ensured by alternately accessing in a plurality of banks. Also, a continuous output of data can be performed by a continuous access (so-called burst access) in the data. By these countermeasures, a high speed operation of the MPU can be attained.

FIG. 2 illustrates a conventional synchronous DRAM memory module using synchronous DRAMs 13. In this memory module, the synchronous DRAMs 13 constituting the first banks #1 and the second banks #2 are aligned along one row on a printed-circuit board (not shown) and a clock driver 12 for supplying a clock signal to the synchronous DRAMs 13 is arranged in one end of the row of the synchronous DRAMs 13. A clock input wire 15 is connected to the clock driver 12 and a clock signal is supplied to the clock driver 12 from a system unit of a computer or the like via the clock input wire 15. Further, the clock driver 12 is connected to the synchronous DRAMs 13 via clock wires 16 and thus the clock signal is supplied to the synchronous DRAMs 13 from the clock driver 12.

In an actual wiring ion the printed-circuit board, the clock wires 16 are laid in tighter in the up-down direction than the illustrated state in FIG. 2.

In FIG. 2, address input terminals (not shown) of the synchronous DRAMs 13 are connected to an address bus (not shown) and the synchronous DRAM 13 addressed by the system unit is accessed. Now, for instance, in the case where different addresses are allocated to bank 1 and bank 2 when using, the selection of either the first banks #1 or the second banks #2 is executed using the addresses of the most significant bit (MSB). Further, in the case where the addresses of bank 1 and bank 2 are assigned to the same addresses in the memory area and the two banks are used for storing high-order bit data and low-order bit data, respectively, the addresses of the MSB are used in common for the first and second banks #1 and #2.

However, in the aforementioned conventional synchronous DRAM memory module, the clock driver 12 for supplying the clock signal to the synchronous DRAMs 13 is arranged out of the row of the synchronous DRAMs 13. Hence, for example, in the two leftmost synchronous DRAMs 13 of the first and second banks #1 and #2, several times of difference is caused in the wiring length of the clock wires 16 in bank 1 and bank 2 and even between the two rightmost synchronous DRAMs 13 with the least difference, there is approximately twice difference in the wiring length. Also, in the conventional memory module, between the leftmost and rightmost synchronous DRAMs within the same bank, several times of difference arises in the wiring length. Since a wiring capacity and a wiring resistance are parasitic on the wires, a difference in the wiring length can produce a difference in the clock timing delay. This difference can be ignored in low speed memories, but in high speed memories operated at a high speed such as 100 MHz extent, the difference in the clock delay can cause a problem in a skew matching.

Within the same memory, owing to the dispersion of the clock timing delay, it is necessary to take a large margin for the timing relative to another signal and as a result, to invite the low speed of the writing and reading operations. Further, for instance, between the data output from bank 1 and the data output from bank 2, which are intrinsically a series of the same data, a difference is caused in the timing between the upper and lower bits. Alternatively, the data of the high-order bits and the low-order bits are stored in bank 1 and bank 2 at different timings. According to circumstances, in these phenomena, in particular, the timing lag between the bits within the same data with respect to the operating speed increases much and in a circuit handling the input and output data, various problems due to the skew mismatching arise.

SUMMARY OF THE INVENTION

Accordingly, it is an object of the present invention to provide a synchronous DRAM memory module in view of the aforementioned problems of the prior art, which is capable of preventing a time difference of a timing signal in a data recording and reproducing operation every bank and solving a skew mismatching.

In order to achieve the object of the present invention, a synchronous DRAM memory module comprises: a plurality of banks on a printed-circuit board; a plurality of synchronous DRAMs separately arranged in the banks; and a clock driver having terminals for supplying a clock signal to either a pair of or a set of synchronous DRAMs included in the different banks from one terminal via clock wires so that clock wire distances from one terminal of the clock driver to either the pair of or the set of synchronous DRAMs are determined to nearly equal.

Further, a pair of synchronous DRAMs in the different banks are coupled by a first clock wire and a center of the first clock wire is connected to one terminal of the clock driver by a second clock wire.

Also, the clock driver is mounted in a central portion of the printed-circuit board and the synchronous DRAMs are arranged on left and right hand sides of the clock driver in the different banks. Wiring lengths of the clock wires for coupling the respective pairs of synchronous DRAMs included in the different banks are substantially equal.

Moreover, a plurality pairs of synchronous DRAMs are arranged on the printed-circuit board and the clock driver is mounted on the printed-circuit board so as to position at nearly an equal distance from the pairs of synchronous DRAMs.

Hence, in the synchronous DRAM memory module of the present invention, the wiring distances for supplying the same clock signal to either the pair of or the set of synchronous DRAMs included in the different banks are determined to nearly equal. Hence, the clock wire lengths between the synchronous DRAMs in the different banks and one terminal of the clock driver are determined to nearly equal and no time difference is caused in the timing signals of the data recording and reproducing operations every bank.

BRIEF DESCRIPTION OF THE DRAWINGS

The objects, features and advantages of the present invention will become more apparent from the consideration of the following detailed description, taken in conjunction with the accompanying drawings, in which:

FIG. 5 is a block diagram of a second embodiment of a synchronous DRAM memory module according to the present invention.

DESCRIPTION OF THE PREFERRED EMBODIMENTS

Figure 1:
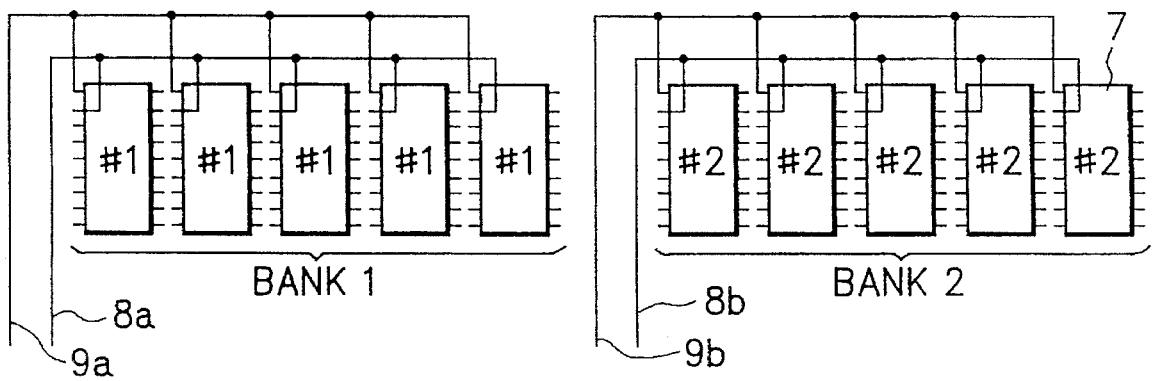
FIG. 1 is a block diagram of a conventional DRAM memory module.
Figure 2:
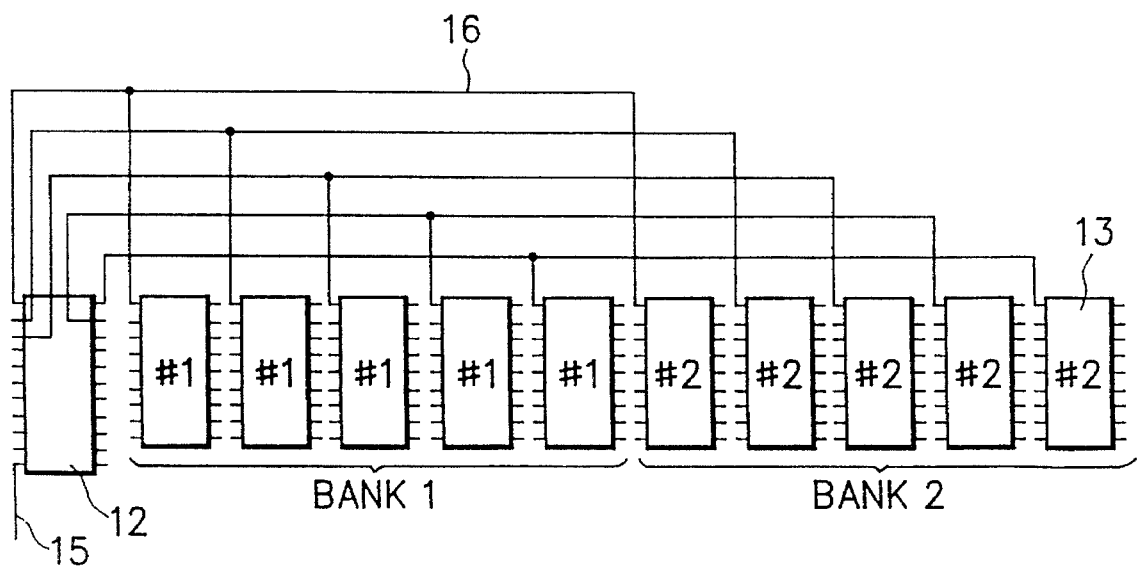
FIG. 2 is a block diagram of a conventional synchronous DRAM memory module.
Figure 3:
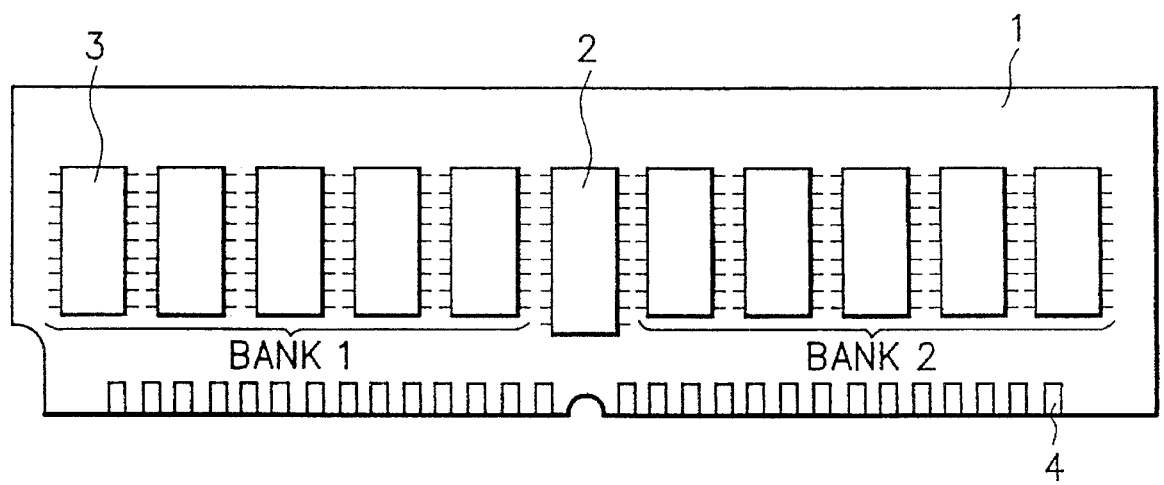
FIG. 3 is an elevational view of an arrangement of parts mounted on a printed-circuit board in a first embodiment of a synchronous DRAM memory module according to the present invention.
Figure 4:
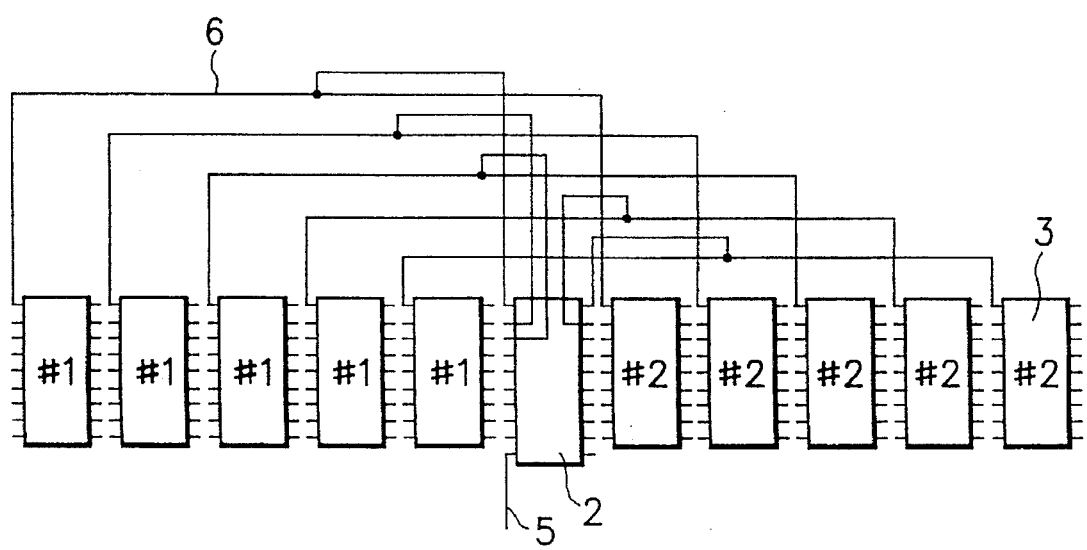
FIG. 4 is a block diagram of the first embodiment of the synchronous DRAM memory module according to the present invention.

Referring now to the drawings, wherein like reference characters designate like or corresponding parts throughout the views and thus the repeated description thereof can be omitted for brevity, there is shown in FIGS. 3 and 4 the first embodiment of a synchronous DRAM memory module according to the present invention.

FIG. 3 shows an arrangement of parts mounted on a printed-circuit board in the first embodiment of a synchronous DRAM memory module and FIG. 4 shows a laying state or configuration of clock signal wires adapted for the arrangement of the parts shown in FIG. 3.

In the parts arrangement shown in FIG. 3, a clock driver 2 is mounted in the center of a printed-circuit board 1 and five synchronous DRAMs 3 included in bank 1 and five synchronous DRAMs 3 included in bank 2 are arranged on the left and right hand sides of the clock driver 2 so that the clock driver 2 and the synchronous DRAMs 3 may be aligned along a straight line to obtain one memory module. In the lower edge part of the printed-circuit board 1, two sets of terminals 4 are formed in the vicinity to the bank 1 and bank 2. These terminals 4 are used for supplying a clock signal to the clock driver 2 and an address signal to the synchronous DRAMs 3 and inputting or outputting data.

As shown in FIG. 4, the synchronous DRAMs 3 are arranged in bank 1 and bank 2 on the left and right hand sides in symmetrical about the clock driver 2 and one first synchronous DRAM #1 in the leftmost position and one second synchronous DRAM #2 in the leftmost position constitute one pair. Similarly, one first synchronous DRAM #1 and one second synchronous DRAM #2, aligned in the second position numbered from the left side end position constitute another pair and a pair of first and second synchronous DRAMs #1 and #2 are determined in this manner.

As shown in FIG. 4, clock signal wires for coupling the synchronous DRAMs 8 are laid as follows. That is, a pair of first and second synchronous DRAMs #1 and #2, for example, the leftmost synchronous DRAMs pair #1 and #2 determined as described above, in bank 1 and bank 2 are coupled by a clock wire 6, that is, by connecting the same number of pin terminals of the first and second synchronous DRAMs #1 and #2 using the clock wire 6. And the center of the clock wire 6 coupling the pair of first and second synchronous DRAMs #1 and #2 is connected to an output terminal of the clock driver 2 by another clock wire 6. Five pairs of first and second synchronous DRAMs #1 and #2 are coupled using the clock wires 6 in the same manner as described above. To the clock driver 2, the clock signal is supplied from a system unit (not shown) via the terminal 4 and a clock input wire 5.

In this synchronous DRAM memory module, the clock wire length is equal in the pair of first and second synchronous DRAMs #1 and #2 in bank 1 and bank 2 and hence no difference of the clock signal delay is caused in this pair. Hence, the timing matching within the synchronous DRAMs 3 can readily be carried out. Further, when bank 1 and bank 2 assigned to different memory areas are used, there is no difference of information delay owing to the difference in banks between the same bits. Moreover, when bank 1 and bank 2 are used for storing the high-order bits and the low-order bits of the same data, the timing lag between the bits within the same data is largely reduced and thus a skew matching can readily be performed.

Further, in this construction of the synchronous DRAM memory module, the difference among the clock wire lengths within the same bank is largely reduced and hence the difference of the timing lag within the bank is largely reduced. As a result, the problem of the skew matching can be solved and the timing lag between the bits at the data output within the same data can be largely reduced.

Moreover, in the synchronous DRAM memory module of the present invention, the clock driver 2 is arranged in the center of the memory module and the maximum wire length is shortened in comparison to the conventional memory module. Hence, the faster operation can be attained.

In FIG. 5, there is shown the second embodiment of a synchronous DRAM memory module according to the present invention.

In this embodiment, the bank number of the synchronous DRAMs is increased to four to increase the memory capacity. In this case, the banks allocated with addresses of the different memory areas can be used and the bits of a part of the data can be stored by the two to four banks.

Also, in this embodiment, the clock wire lengths in coupling the corresponding synchronous DRAMs among the four banks can be made equal in the same manner as the first embodiment described above. Hence, since the difference of the clock wire lengths within the same bank can largely be reduced, the same effects as those of the first embodiment can be obtained.

Although the embodiments have been described in connection with the memory module having two to four banks, of course, the number of banks can further be increased. Also, the number of the synchronous DRAMs in each bank can be determined to a suitable number between from one to the plural. Moreover, although only the memory module formed on the printed-circuit board has been described in the embodiments, the memory module can be mounted along with another semiconductor device on the same printed-circuit board. Furthermore, concerning the bit construction of the synchronous DRAMs used in the present invention, there is no restriction and thus any products available in the market can be used. Further, the memory module according to the present invention can be applied to various devices such as a main memory device of computers, a substitute of VRAM or the like and its application is not restricted in any way.

As described above, in the synchronous DRAM memory module of the present invention, the wiring distances for supplying the same clock signal to a pair or a set of synchronous DRAMs arranged in a plurality of banks from the clock driver are designed to be substantially equal. Hence since the clock wire lengths of the corresponding synchronous DRAMs among the banks can be set to be equal, no difference is caused in the clock delay among them and the skew matching problem among them can be solved. Further, when banks assigned with addresses of different areas are used, there is no difference in information delay owing to difference of banks between the same bits. Moreover, when the banks are used for storing different bit parts of the same data, the timing lag between the bits within the same data can be largely reduced and the skew matching in the circuits dealing with the output data can readily be carried out.

Although the present invention has been described in its preferred embodiments with reference to the accompanying drawings, it readily understood that the present invention is not restricted to the preferred embodiments and that various changes and modifications can be made by those skilled in the art without departing from the spirit and scope of the present invention.

What is claimed is:

1. A synchronous DRAM memory module, comprising:
    a plurality of banks on a printed-circuit board;
    a plurality of synchronous DRAMs separately arranged in the banks; and
    a clock driver having terminals for supplying a clock signal to either a pair of or a set of synchronous DRAMs included in the different banks from one terminal via clock wires so that clock wire distances from one terminal of the clock driver to either the pair of or the set of synchronous DRAMs being determined to nearly equal.

2. A synchronous DRAM memory module as claimed in claim 1, wherein:
    a pair of synchronous DRAMs in the different banks are coupled by a first clock wire; and
    a center of the first clock wire is connected to one terminal of the clock driver by a second clock wire.

3. A synchronous DRAM memory module as claimed in claim 1, wherein:
    the clock driver is mounted in a central portion of the printed-circuit board; and
    the synchronous DRAMs are arranged on left and right hand sides of the clock driver in the different banks.

4. A synchronous DRAM memory module as claimed in claim 3, wherein:
    wiring lengths of the clock wires for coupling the respective pairs of synchronous DRAMs included in the different banks are substantially equal.

5. A synchronous DRAM memory module as claimed in claim 1, wherein:
    a plurality pairs of synchronous DRAMs are arranged on the printed-circuit board; and
    the clock driver is mounted on the printed-circuit board so as to position at nearly an equal distance from the pairs of synchronous DRAMs.

6. A synchronous DRAM memory module, comprising:
    clock signaling means for supplying a clock signal;
    a first DRAM pair having a first synchronous DRAM, a second synchronous DRAM, a first clock wire, and a second clock wire;
    said first clock wire connecting said first synchronous DRAM with said second synchronous DRAM, and having a center point which is substantially equidistant, electrically, from said first and said second synchronous DRAMS; and
    said second clock wire connecting said center point with said clock signaling means.

7. A synchronous DRAM memory module as claimed in claim 6, wherein:
    said clock signaling means is disposed between said first and said second synchronous DRAMs.

8. A synchronous DRAM memory module as claimed in claim 6, further comprising a second said DRAM pair;
    said first synchronous DRAM of said first DRAM pair and said first synchronous DRAM of said second DRAM pair defining a first DRAM bank;
    said second synchronous DRAM of said first DRAM pair and said second synchronous DRAM of said second DRAM pair defining a second DRAM bank;
    said clock signaling means having a plurality of clock signal terminals; and
    each said second clock wire being connected to a respective clock signal terminal.

9. A synchronous DRAM memory module as claimed in claim 8, wherein:
    said clock signaling means is disposed between said first and said second DRAM banks.

10. A synchronous DRAM memory module as claimed in claim 8, further comprising:
    another said first DRAM bank, thereby forming a plurality of first DRAM banks; and
    another said second DRAM bank, thereby forming a plurality of second DRAM banks.

11. A synchronous DRAM memory module as claimed in claim 10, wherein:
    said clock signaling means is disposed between said plurality of said first DRAM banks and said plurality of said second DRAM banks.

* * * * *

UNITED STATES PATENT AND TRADEMARK OFFICE
CERTIFICATE OF CORRECTION

PATENT NO.  : 5,495,435
DATED       : February 27, 1996
INVENTOR(S) : Kenji SUGAHARA It is certified that error appears in the above-indentified patent and that said Letters Patent is hereby corrected as shown below:

Col. 1, line 22, delete "GAS", insert --CAS--.

Col. 1, line 59, delete "ion", insert --on--.

Signed and Sealed this

Eleventh Day of June, 1996

*Attest:*

BRUCE LEHMAN

*Attesting Officer*     *Commissioner of Patents and Trademarks*

(12) EX PARTE REEXAMINATION CERTIFICATE (6808th)
United States Patent
Sugahara

(10) Number: US 5,495,435 C1
(45) Certificate Issued: May 12, 2009

(54) SYNCHRONOUS DRAM MEMORY MODULE

(75) Inventor: Kenji Sugahara, Tokyo (JP)

(73) Assignee: NEC Electronics Corporation, Nakahara-Ku, Kawasaki, Kanagawa (JP)

Reexamination Request:
No. 90/008,999, Jan. 24, 2008

Reexamination Certificate for:
Patent No.: 5,495,435
Issued: Feb. 27, 1996
Appl. No.: 08/339,730
Filed: Nov. 14, 1994

Certificate of Correction issued Jun. 11, 1996.

(30) Foreign Application Priority Data

Nov. 18, 1993 (JP) .............................. 5-312726

(51) Int. Cl.
*G11C 5/00* (2006.01)

(52) U.S. Cl. .................. 365/52; 365/230.03; 365/63
(58) Field of Classification Search .................. None
See application file for complete search history.

(56) References Cited

U.S. PATENT DOCUMENTS

| | | |
|---|---|---|
| 4,800,530 A | 1/1989 | Itoh et al. |
| 5,087,829 A | 2/1992 | Ishibashi et al. |
| 5,109,168 A | 4/1992 | Rusu |
| 5,140,184 A | 8/1992 | Hamamoto et al. |
| 5,260,892 A | 11/1993 | Testa |
| 5,495,435 A | 2/1996 | Sugahara |

FOREIGN PATENT DOCUMENTS

| | | |
|---|---|---|
| JP | 05-128214 | 5/1993 |
| JP | 05-233092 | 9/1993 |

*Primary Examiner*—Deandra M Hughes

(57) ABSTRACT

A clock driver is mounted in the center of a printed-circuit board, and a plurality of synchronous DRAMs are arranged on left and right hand sides of the clock driver in different banks. A clock signal is supplied from the clock driver to the synchronous DRAMs via clock wires. Wiring distances for supplying the clock pulse from the clock driver to a pair of synchronous DRAMs included in the different banks are determined to nearly equal to prevent a time difference of a timing signal in a data recording and reproducing operations of the respective banks and to solve a skew mismatching.

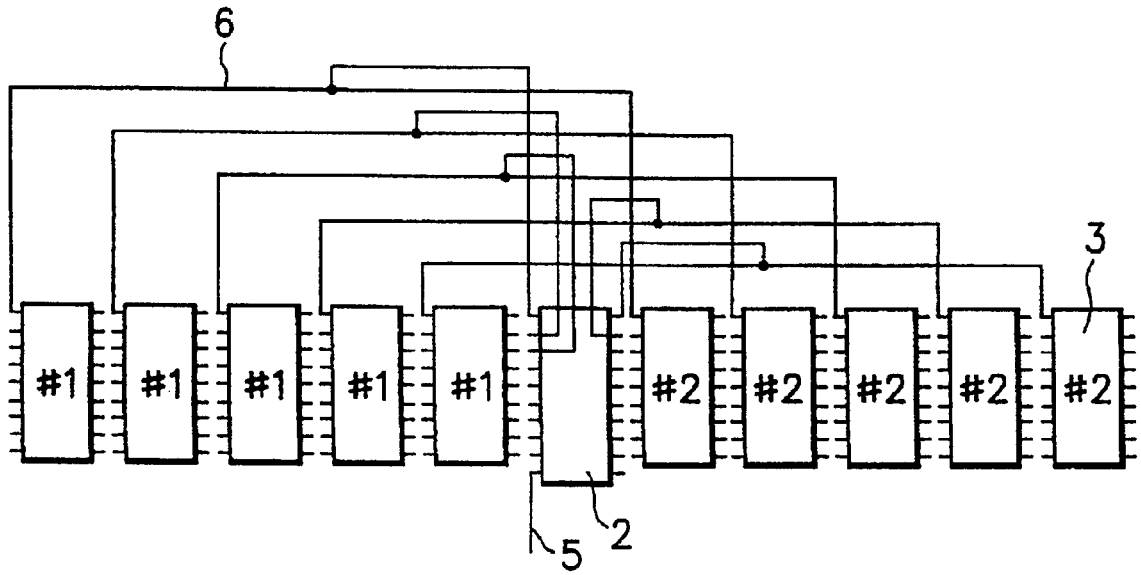

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 3–5 are cancelled.

Claims 2 and 6 are determined to be patentable as amended.

Claims 7–11, dependent on an amended claim, are determined to be patentable.

2. A synchronous DRAM memory module [as claimed in claim 4] , [:]
*comprising:*
*a plurality of banks on a printed-circuit board;*
*a plurality of pairs of synchronous DRAMs separately arranged in the banks; and*
*a clock driver having terminals for supplying a clock signal to either a pair of or a set of synchronous DRAMs included in the different banks from one terminal via clock wires so that clock wire differences from one terminal of the clock driver to either the pair of or the set of synchronous DRAMs being determined to be nearly equal,*
*wherein the clock driver is mounted in a central position of the printed-circuit board,*
*wherein the synchronous DRAMs are arranged on left and right hand sides of the clock driver in the different banks,*
*wherein wiring lengths of the clock wires for coupling the respective pairs of synchronous DRAMs included in the different banks are substantially equal,*
wherein a pair of synchronous DRAMs in the different banks are coupled by a first clock wire[;] , and
*wherein* a center of the first clock wire is connected to one terminal of the clock driver by a second clock wire.

6. A synchronous DRAM memory module, comprising:
clock signaling means for supplying a clock signal;
a first DRAM pair having a first synchronous DRAM, a second synchronous DRAM, a first clock wire, and a second clock wire;
said first clock wire connecting said first synchronous DRAM with said second synchronous DRAM, and having a center point which is substantially equidistant, electrically, from said first and second synchronous DRAMS; [and]
said second clock wire connecting said center point with said clock signaling means[.] ,
*wherein wiring lengths of the clock wires for coupling the first pair of synchronous DRAMS included in the different banks are substantially equal.*

* * * * *